(12) United States Patent
Miller

(10) Patent No.: US 7,266,205 B2
(45) Date of Patent: Sep. 4, 2007

(54) LINEARIZED FILTER BAND EQUIPMENT AND PROCESSES

(75) Inventor: Raymond S. Miller, Shoreline, WA (US)

(73) Assignee: Rane Corporation, Mukilteo, WA (US)

( * ) Notice: Subject to any disclaimer, the term of this patent is extended or adjusted under 35 U.S.C. 154(b) by 677 days.

(21) Appl. No.: 10/341,812

(22) Filed: Jan. 13, 2003

(65) Prior Publication Data

US 2004/0136548 A1 Jul. 15, 2004

(51) Int. Cl.
- *H03G 5/00* (2006.01)
- *H03G 9/00* (2006.01)
- *H03G 5/02* (2006.01)
- *H03G 5/06* (2006.01)
- *H03G 9/06* (2006.01)
- *G06F 15/00* (2006.01)
- *H04B 15/00* (2006.01)

(52) U.S. Cl. .................. 381/103; 381/98; 381/101; 381/102; 333/28 T; 702/196

(58) Field of Classification Search .............. 333/28 T, 333/165–166, 167; 381/103, 48–102; 702/196; 330/303

See application file for complete search history.

(56) References Cited

U.S. PATENT DOCUMENTS

| | | |
|---|---|---|
| 4,939,782 A | 7/1990 | Gambacurta, Jr. et al. |
| 5,687,104 A | 11/1997 | Lane et al. |

OTHER PUBLICATIONS

"Graphic Equalizers 30GE-1 30GE-2," TDM Design, Inc., Hillsboro, OR, date unknown.
"An Amazing Advancement Makes This Graphic Equalizer Unique," t.c. electronic of Denmark, Denmark, circa 1996.
Dr. -Ing. Seyed-Ali Azizi "Audio Engineering Society Convention Paper 5482: A new Concept of Interference Compensation for Parametric and Graphic Equalizer Banks," 111th Convention of the Audio Engineering Society, New York, New York, Sep. 21-24, 2001, pp. 1-8.

*Primary Examiner*—Vivian Chin
*Assistant Examiner*—Douglas Suthers
(74) *Attorney, Agent, or Firm*—Kevin D. Jablonski

(57) ABSTRACT

A method for use with equipment having filters, the method characterized by multiplying a matrix having a specified cut-boost setting of a filter of a graphic equalizer by a correction matrix to create a matrix having a corrected cut-boost setting of the filter of the graphic equalizer; adjusting an actual cut-boost setting of the filter of the graphic equalizer to be substantially equal to the corrected cut-boost setting of the filter of the graphic equalizer; and configuring the filter to have a Q value substantially equal to a linearizing Q value. In addition to the foregoing, other method embodiments are described in the claims, drawings, and text forming a part of the present application. In one or more various embodiments, related systems include but are not limited to circuitry and/or programming for effecting the foregoing-referenced method embodiments; the circuitry and/or programming can be virtually any combination of hardware, software, and/or firmware configured to effect the foregoing-referenced method embodiments depending upon the design choices of the system designer.

34 Claims, 16 Drawing Sheets

| Q  Cut-Boost dB | Value of Q(dB) Which linearizes Filter$_A$ Filter having Center Frequency$_A$ |
|---|---|
| 12 | $Q_A(12dB)$ |
| 8 | $Q_A(8dB)$ |
| 4 | $Q_A(4dB)$ |
| 0 | $Q_A(0dB)$ |
| -4 | $Q_A(-4dB)$ |
| -8 | $Q_A(-8dB)$ |
| -12 | $Q_A(-12dB)$ |
| -16 | $Q_A(-16dB)$ |

| Q  Cut-Boost dB | Value of Q(dB) Which linearizes Filter$_B$ Filter having Center Frequency$_B$ |
|---|---|
| 12 | $Q_B(12dB)$ |
| 8 | $Q_B(8dB)$ |
| 4 | $Q_B(4dB)$ |
| 0 | $Q_B(0dB)$ |
| -4 | $Q_B(-4dB)$ |
| -8 | $Q_B(-8dB)$ |
| -12 | $Q_B(-12dB)$ |
| -16 | $Q_B(-16dB)$ |

| Q  Cut-Boost dB | Value of Q(dB) Which linearizes Filter$_C$ Filter having Center Frequency$_C$ |
|---|---|
| 12 | $Q_C(12dB)$ |
| 8 | $Q_C(8dB)$ |
| 4 | $Q_C(4dB)$ |
| 0 | $Q_C(0dB)$ |
| -4 | $Q_C(-4dB)$ |
| -8 | $Q_C(-8dB)$ |
| -12 | $Q_C(-12dB)$ |
| -16 | $Q_C(-16dB)$ |

Q values chosen such that change in cut-boost level results in linearly proportional change in magnitude response at the defined point of linearity reference frequency

Figure 4D

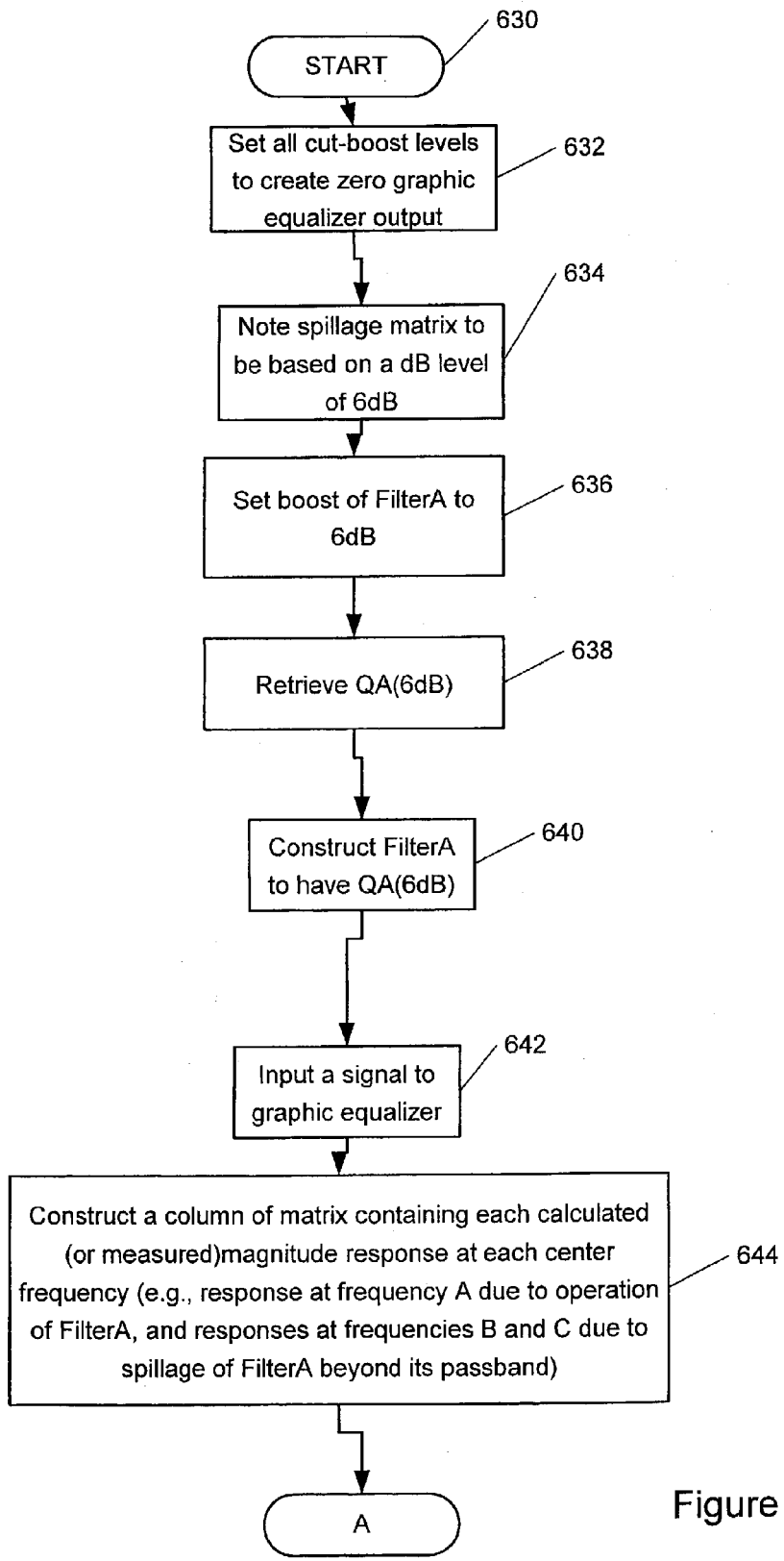
Figure 5A1

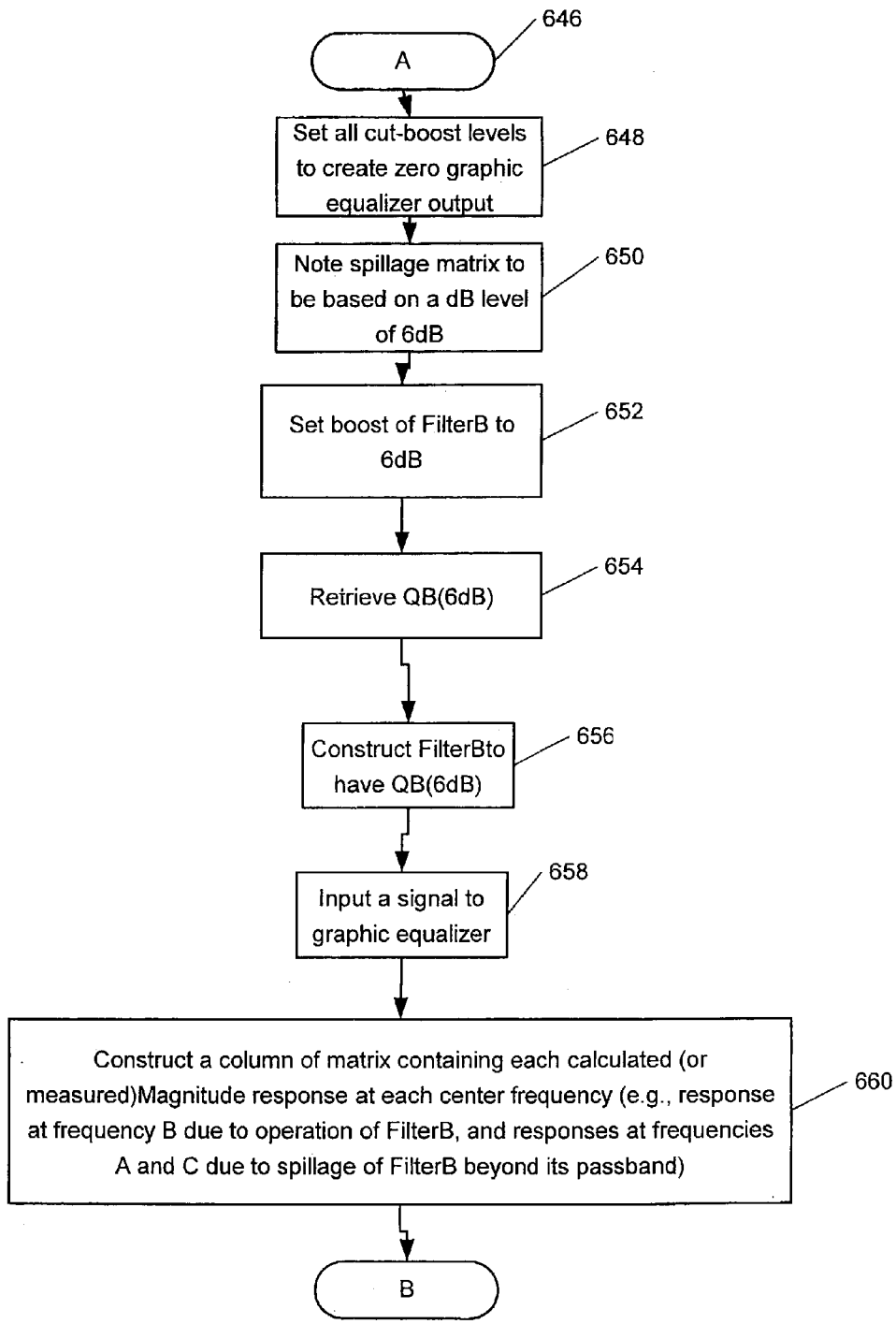
Figure 5A2

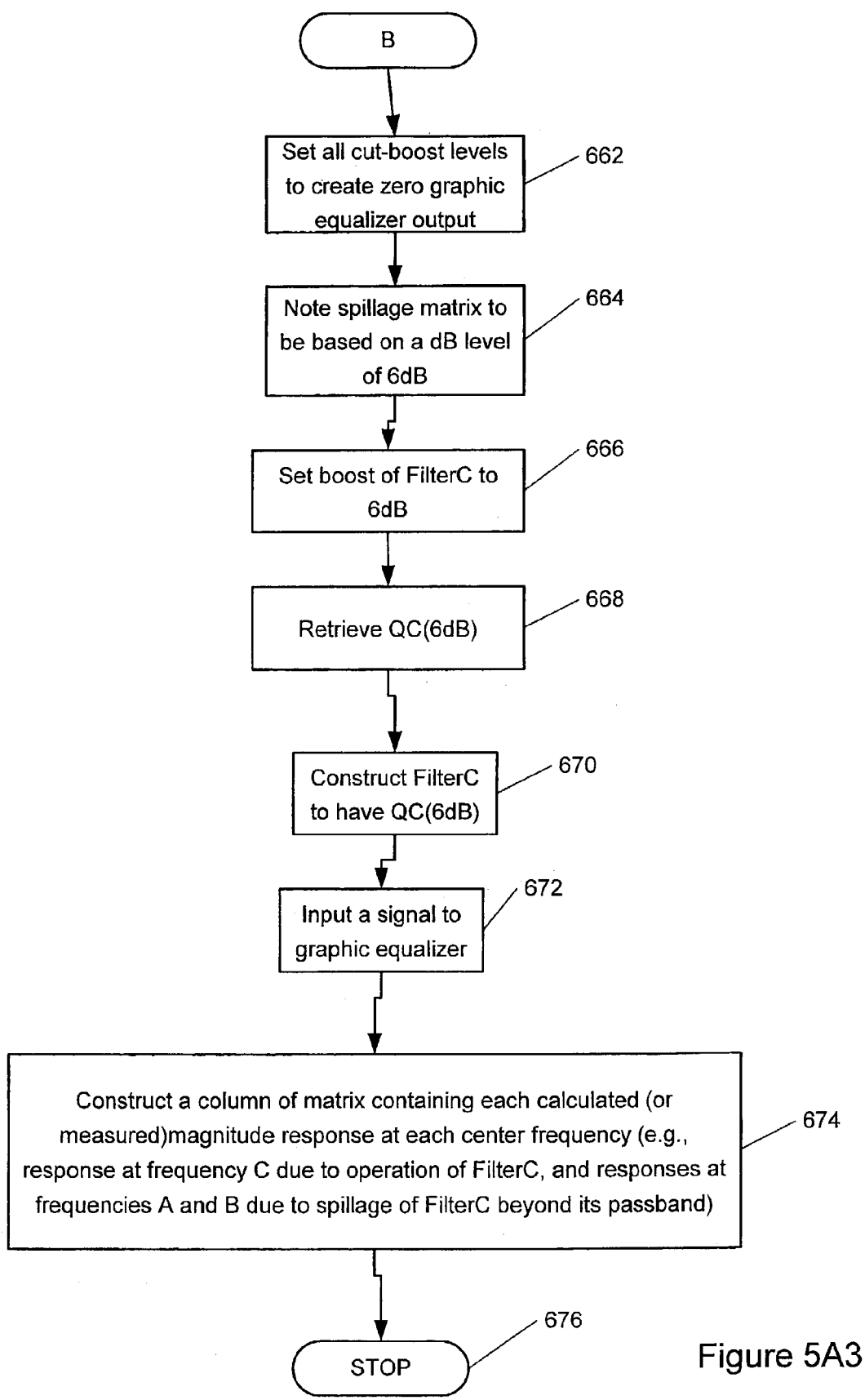
Figure 5A3

| Beyond Passband Bleeding at 6dB | FILTER$_A$ | FILTER$_B$ | FILTER$_C$ |
|---|---|---|---|
| Center Freq. A | 6dB | dB magnitude at Freq. A due to spillage beyond passband Filter$_B$ | dB magnitude at Freq. A due to spillage beyond passband Filter$_C$ |
| Center Freq. B | dB magnitude at Freq. B due to spillage beyond passband Filter$_A$ | 6dB | dB magnitude at Freq. B due to spillage beyond passband Filter$_C$ |
| Center Freq. C | dB magnitude at Freq. C due to spillage beyond passband Filter$_A$ | dB magnitude at Freq. C due to spillage beyond passband Filter$_B$ | 6dB |

↖ 620

Normalize beyond passband spillage matrix by dividing by 6dB

| Beyond Passband Bleeding at 6dB | FILTER$_A$ | FILTER$_B$ | FILTER$_C$ |
|---|---|---|---|
| Center Freq. A | $\left(\dfrac{6dB}{6dB}\right)$ | $\dfrac{\left(\begin{array}{c}\text{dB bleed from}\\ \text{Filter}_B \text{ at Freq. A}\end{array}\right)}{6dB}$ | $\dfrac{\left(\begin{array}{c}\text{dB bleed from}\\ \text{Filter}_C \text{ at Freq. A}\end{array}\right)}{6dB}$ |
| Center Freq. B | $\dfrac{\left(\begin{array}{c}\text{dB bleed from}\\ \text{Filter}_A \text{ at Freq. B}\end{array}\right)}{6dB}$ | $\left(\dfrac{6dB}{6dB}\right)$ | $\dfrac{\left(\begin{array}{c}\text{dB bleed from}\\ \text{Filter}_C \text{ at Freq. B}\end{array}\right)}{6dB}$ |
| Center Freq. C | $\dfrac{\left(\begin{array}{c}\text{dB bleed from}\\ \text{Filter}_A \text{ at Freq. C}\end{array}\right)}{6dB}$ | $\dfrac{\left(\begin{array}{c}\text{dB bleed from}\\ \text{Filter}_B \text{ at Freq. C}\end{array}\right)}{6dB}$ | $\left(\dfrac{6dB}{6dB}\right)$ |

↖ 621  ↙ 622

Obtain correction matrix for 6dB by Inverting $$\begin{bmatrix} \left(\dfrac{6dB}{6dB}\right) & \dfrac{\left(\begin{array}{c}\text{dB bleed from}\\ \text{Filter}_B \text{ at Freq. A}\end{array}\right)}{6dB} & \dfrac{\left(\begin{array}{c}\text{dB bleed from}\\ \text{Filter}_C \text{ at Freq. A}\end{array}\right)}{6dB} \\ \dfrac{\left(\begin{array}{c}\text{dB bleed from}\\ \text{Filter}_A \text{ at Freq. B}\end{array}\right)}{6dB} & \left(\dfrac{6dB}{6dB}\right) & \dfrac{\left(\begin{array}{c}\text{dB bleed from}\\ \text{Filter}_C \text{ at Freq. B}\end{array}\right)}{6dB} \\ \dfrac{\left(\begin{array}{c}\text{dB bleed from}\\ \text{Filter}_A \text{ at Freq. C}\end{array}\right)}{6dB} & \dfrac{\left(\begin{array}{c}\text{dB bleed from}\\ \text{Filter}_B \text{ at Freq. C}\end{array}\right)}{6dB} & \left(\dfrac{6dB}{6dB}\right) \end{bmatrix}^{-1}$$

Figure 5B

Perfect-Q Filter Portion

Single Filter Band

Perfect-Q Real-Time Portion

LINEARIZED FILTER BAND EQUIPMENT AND PROCESSES

FIELD OF THE INVENTION

The present invention relates, in general, to filtering devices. More specifically, the present invention is related to digital signal processing filters and/or analog filters.

BACKGROUND OF THE INVENTION

Filtering devices allow for direct selection or suppression of frequency components of electrical signals. Those having ordinary skill in the art will appreciate that, for any particular signal, techniques exist which allow the signal to be approximated by a weighted sum of periodic signals (e.g., sine waves and/or cosine waves which repeat themselves within defined time periods). Each periodic signal in the sum has a certain frequency (inversely related to the time period required for the signal to repeat). The weighted periodic signals which are summed to approximate the analog signal may be referred to as the "frequency components" of the signal. One type of filtering device is known in the art as a "graphic equalizer," since it graphically illustrates the selection or suppression of the various frequency components of a signal.

With reference to the figures, and with reference now to FIG. 1, shows a front elevational view of a control panel of a conventional graphic equalizer 100. Graphic equalizer 100 typically incorporates a plurality of filters (passive or active, digital or analog) which amplify or attenuate electrical signals within discrete frequency passbands. Typically, such equalizers have each filter operated by a slider control related to each discrete passband. Graphic equalizer 100 operates on three frequency bands which are illustrated on a control panel face of graphic equalizer 100. The frequency bands upon which graphic equalizer 100 operates have center frequencies, Frequency A, Frequency B, and Frequency C. Controls 101, associated with each frequency band, allow an operator (e.g., a human operator) to boost (Le., amplify) the frequency band by up to 12 dB or cut (Le., attenuate) the frequency band by upto −12 dB. Depicted, for sake of illustration, is that control 101 of Frequency A is set to a 2 dB boost, control 101 of Frequency B is set to a −2 dB boost, and control 101 of Frequency C is set to a 6 dB boost.

The frequency specific cutting or boosting performed by graphic equalizer 100 is typically achieved by filters centered on frequencies A, B, and C. Those having ordinary skill in the art will recognize that, ideally, each filter would uniformly cut or boost the components of the input signal which exist within passband (eg., 102, 104 and 106 of FIG. 2) of each filter.

FIG. 2 graphically shows magnitude responses of theoretical ideal filters which would preferably be used in conjunction with graphic equalizer 100. Each ideal filter provides a uniform response. A uniform response means that (a) the leftmost and rightmost edges 108, 110 of each passband (a band of frequencies which a filter is designed to let through, or "pass") are substantially vertical at or near the passband cutoff frequencies 116 defining the passband of each filter, and (b) the maximum amplitude 112 is substantially constant or flat in each passband so as to form sharp corner frequency response 114 therebetween. Those skilled in the art will appreciate that, unfortunately, physically realizable filters do not tend to provide the desired response of the "ideal" filters shown in FIG. 2.

FIG. 3 illustrates magnitude responses which are more representative of physically realizable, as opposed to ideal, filters. Rather than having sharp corner dropoff at the cutoff frequency 116 of each filter's passband 102, 104, 106, physically realizable filters tend to roll off gently rather than have sharp "corner" frequency responses (e.g., 114 of FIG. 2). The fact that physically realizable filters do not provide sharp cutoff allows the energy from one frequency band of the graphic equalizer to bleed into the other frequency bands of the graphic equalizer. As can be seen, such interference tends to be additive, and thus gives rise to a resultant aggregate frequency response 120 which is not at all in keeping with the desired frequency response.

One known desired theoretical solution to the foregoing noted interference problem of FIG. 3 is to manipulate the filtering so as to subtract out the bleeding of the respective filters beyond the cutoff frequencies 116 defining their respective passbands 102, 104, 106. However, as will be appreciated by those having ordinary skill in the art, both the behavior of the individual filters as well as the interactions between filter bleeds, tends to be highly nonlinear and/or unpredictable. The effect of this is that it is extremely difficult to use known techniques to alleviate the interference problems, so in practice the desired theoretical approach is typically not achieved.

One example of how interference problems, such as those illustrated and described in relation to FIG. 3, have previously been addressed in the prior art is disclosed in U.S. Pat. No. 5,687,104 to Lane et al. (hereinafter Lane). Lane teaches generating a unique decoupling matrix by exciting a graphic equalizer using a series of test input vectors applied to a series of pre-stored decoupling matrices, and selecting as the decoupling matrix that matrix which generates the least overall error in graphic equalizer output. Thereafter, user specified graphic equalizer cut-boost input levels are subjected to the selected decoupling matrix to create corrected inputs. The graphic equalizer is then internally set to have these corrected inputs and allowed to operate.

One drawback of the method disclosed by Lane, and other related-art techniques, is that Lane tends to work with fixed Q value filters. (A Q value is a number roughly indicating how well a "real world" filter approaches that of a theoretically ideal filter, such as how "sharp" the corner frequency response 114 will be.) Lane's, and other related-art techniques, also do not recognize that non-linearity of interactions between filters having fixed Q values varies dependent upon selected cut-boost levels. Accordingly, Lane's, and other related art techniques, do not show or suggest alleviating the non-linearity of interactions between filters by constructing filters having "linearizing" Q values which tend to linearize the interactions between filters. Accordingly, a need exists for a graphic equalizing filter system which utilizes linear techniques on filters having linearizing Q values.

BRIEF SUMMARY OF THE INVENTION

It is an object of the invention to provide various method and system embodiments which utilize cut-boost level dependent Q values which tend to linearize interactions between filters in equipment having filters.

In one preferred embodiment, a method for use with equipment having filters includes but is not limited to multiplying a matrix having a specified cut-boost setting of a filter of a graphic equalizer by a correction matrix to create a matrix having a corrected cut-boost setting of the filter of the graphic equalizer; adjusting an actual cut-boost setting of the filter of the graphic equalizer to be substantially equal to the corrected cut-boost setting of the filter of the graphic equalizer; and configuring the filter to have a Q value substantially equal to a linearizing Q value. In addition to the foregoing, other method embodiments are described in the claims, drawings, and text forming a part of the present application.

In one or more various alternate embodiments, related systems include but are not limited to circuitry and/or programming for effecting the foregoing-referenced method embodiments; the circuitry and/or programming can be a combination of hardware, software, and/or firmware configured to effect the foregoing—referenced method embodiments depending upon the design choices of the system designer.

In one alternate embodiment, a sound system includes but is not limited to at least one filter having a Q value configurable responsive to a defined cut-boost setting of the filter.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE SEVERAL VIEWS OF THE DRAWING(S)

FIG. 4D illustrates three tables which show that for each filter in a graphic equalizer (e.g., graphic equalizer 100), Q values are determined such that when the cut-boost levels of the filters are varied in a linear fashion the magnitude responses at some defined distance away from the center frequency (e.g., ⅓ octave from the center frequency) vary in a linear fashion.

FIGS. 5A1–3 and 5B show a representative example of one method of the generation of a correction matrix.

Figure 6A:
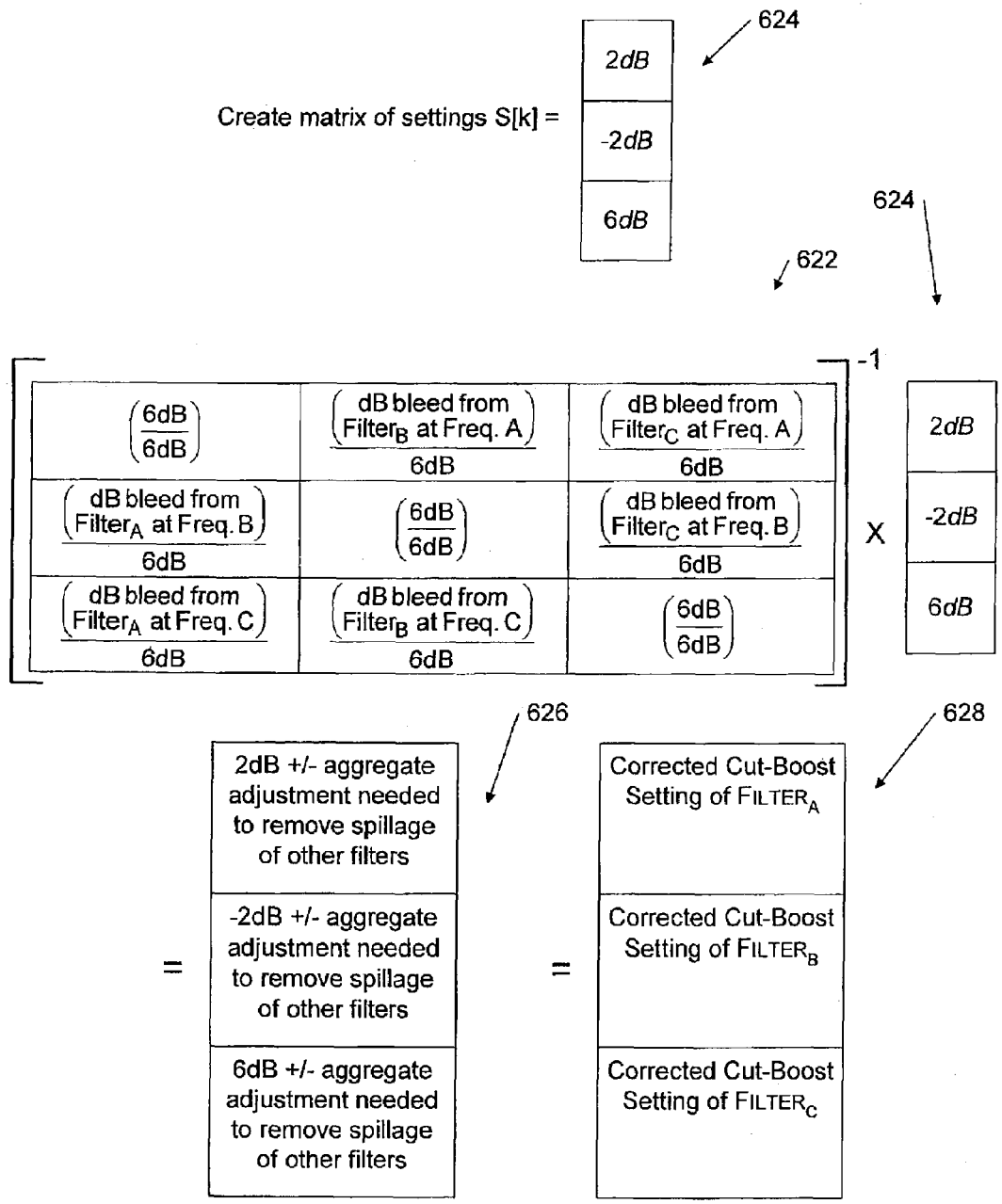
Figure 6B:
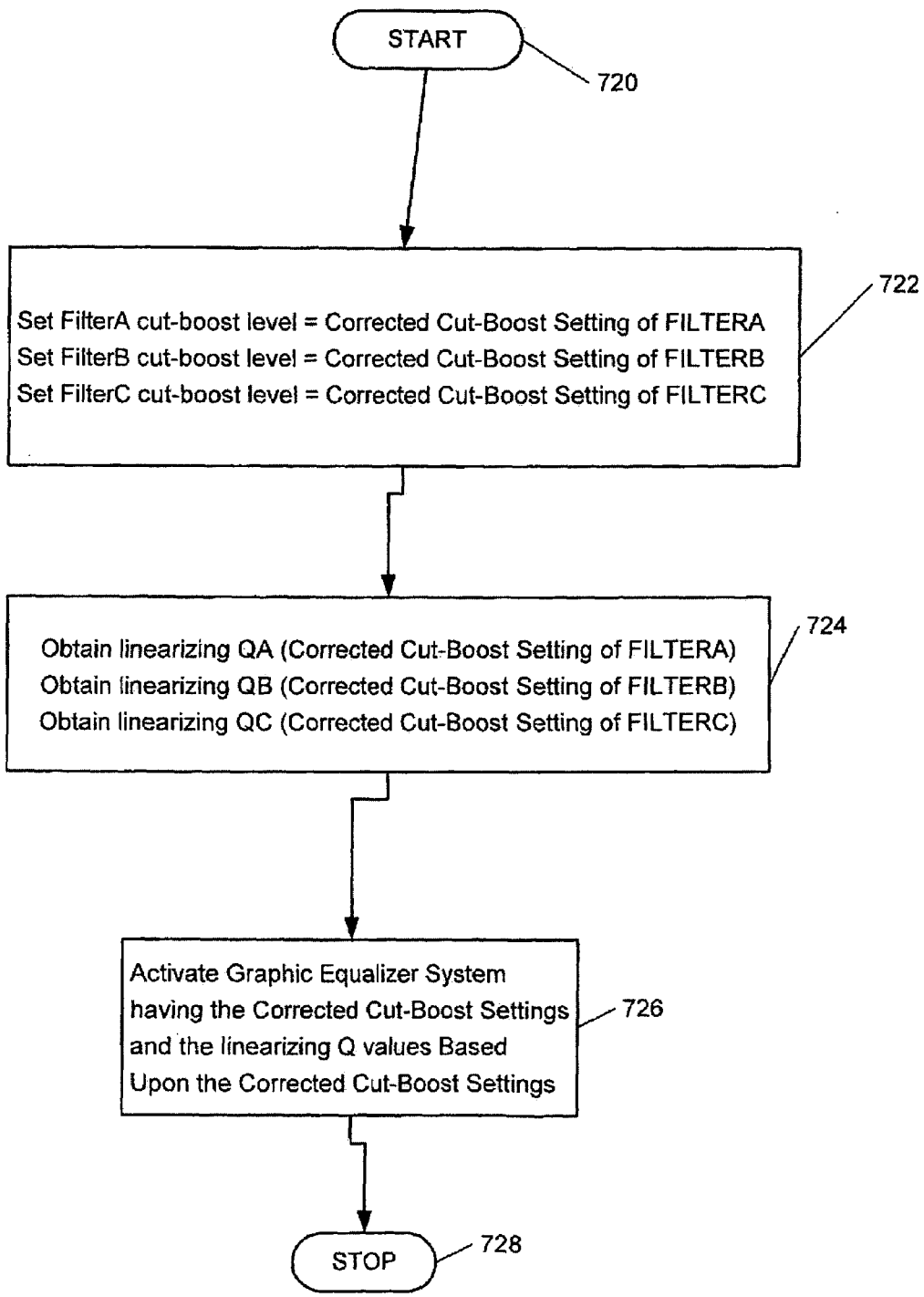

FIGS. 6A and 6B show a concrete example depicting how one embodiment uses the correction matrix to adjust the cut-boost settings of the individual filters to provide compensation such that the output of the graphic equalizer is "as if" no cross filter interference were present.

Figure 7:
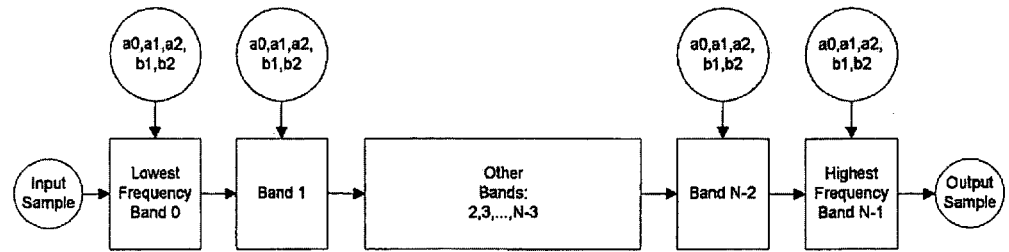

FIG. 7 illustrates graphic equalizer 100 composed of cascaded digital filters which operate on frequency bands indexed from 0 to N–1.

Figure 8:
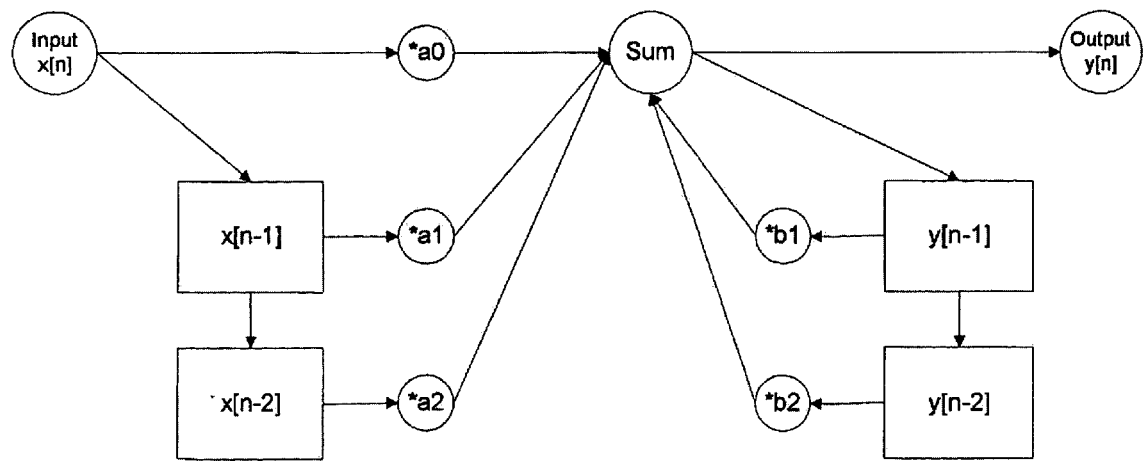

FIG. 8 shows an alternate view of the first cascaded filter depicted in FIG. 7.

Figure 9:
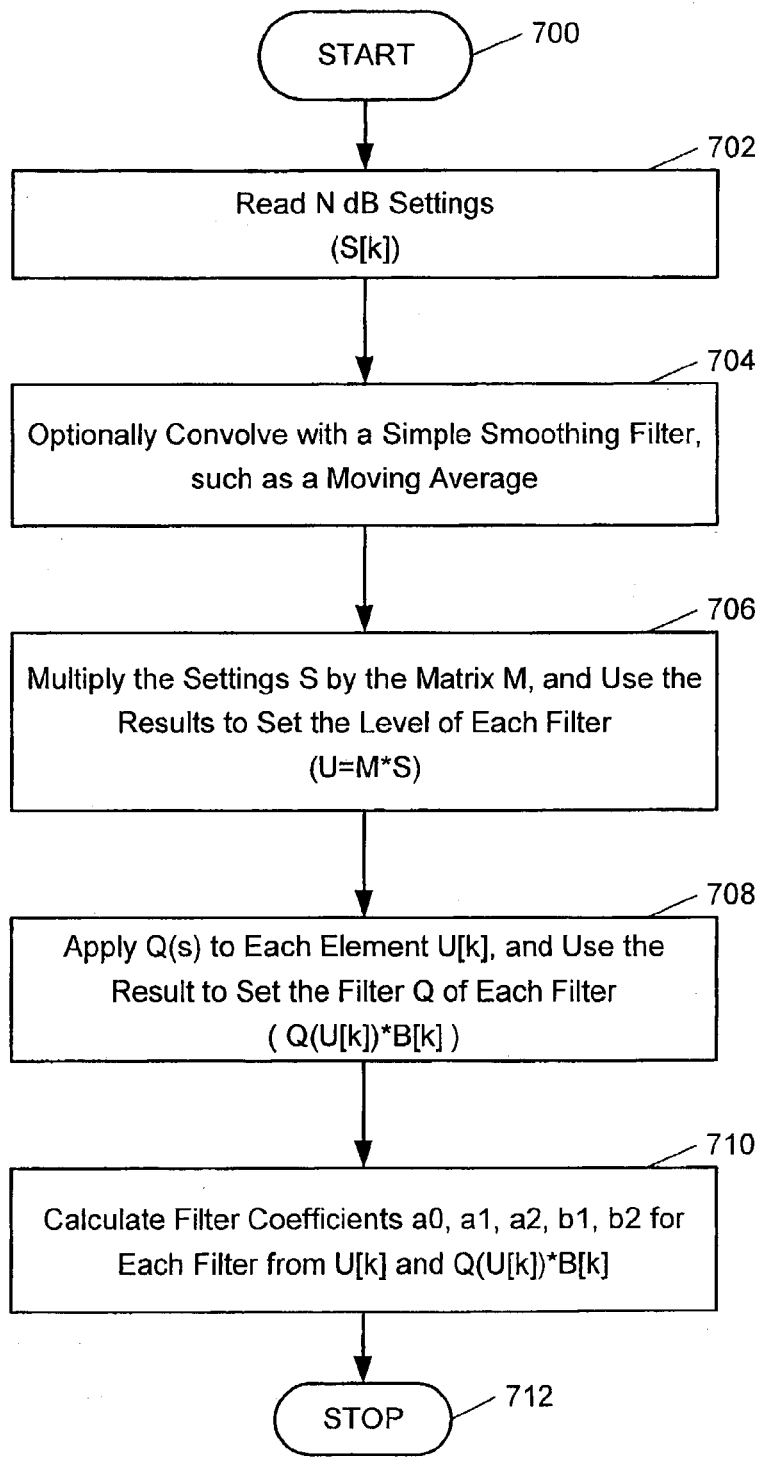

FIG. 9 shows a high-level logic flowchart depicting a real-time portion of one implementation of the herein described subject matter.

Figure 10:
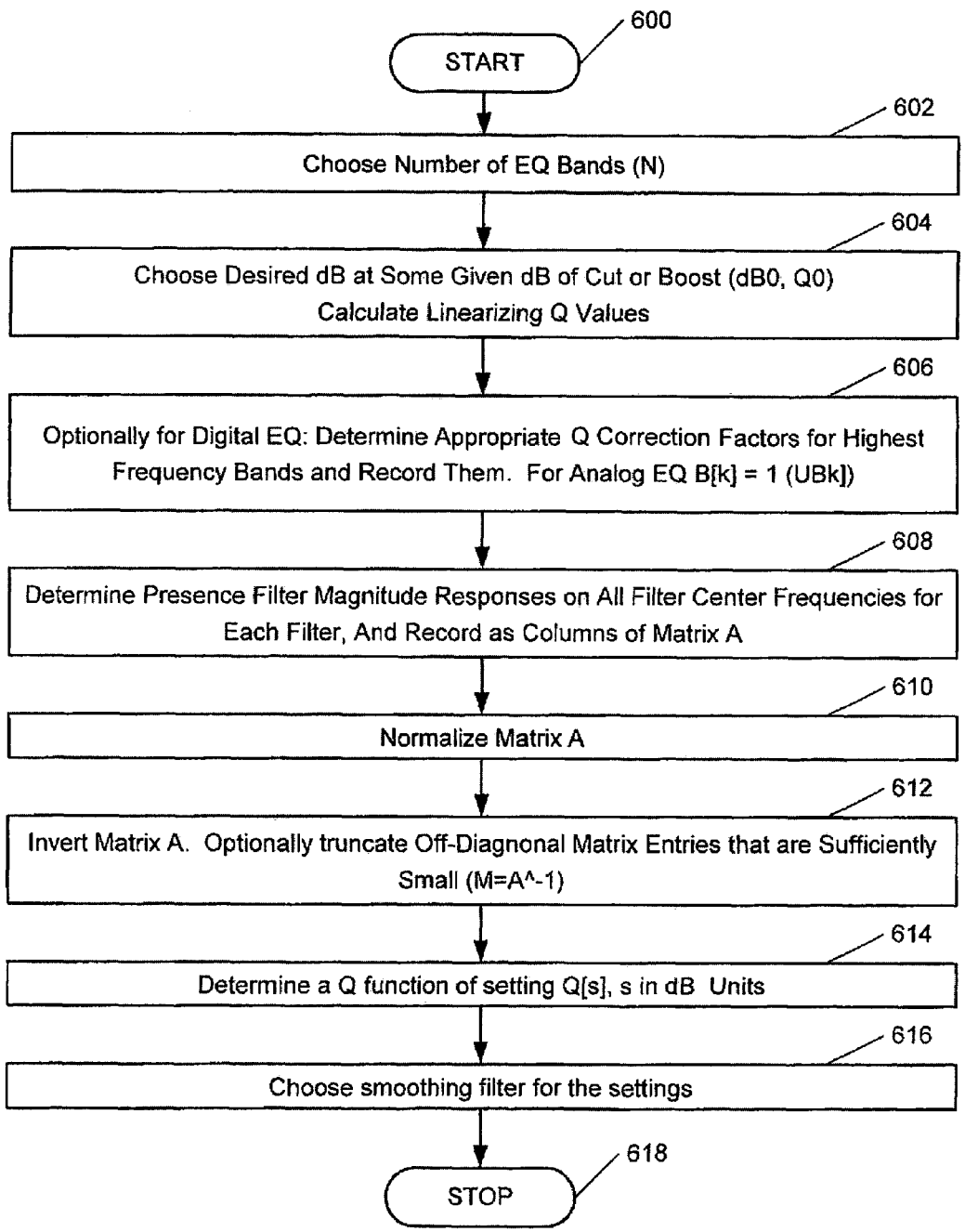

FIG. 10 shows a high-level logic flowchart illustrating a pre-processing, offline, portion of an implementation of the subject matter of the present application.

The use of the same symbols in different drawings typically indicates similar or identical items.

DETAILED DESCRIPTION OF THE INVENTION

Figure 4A:
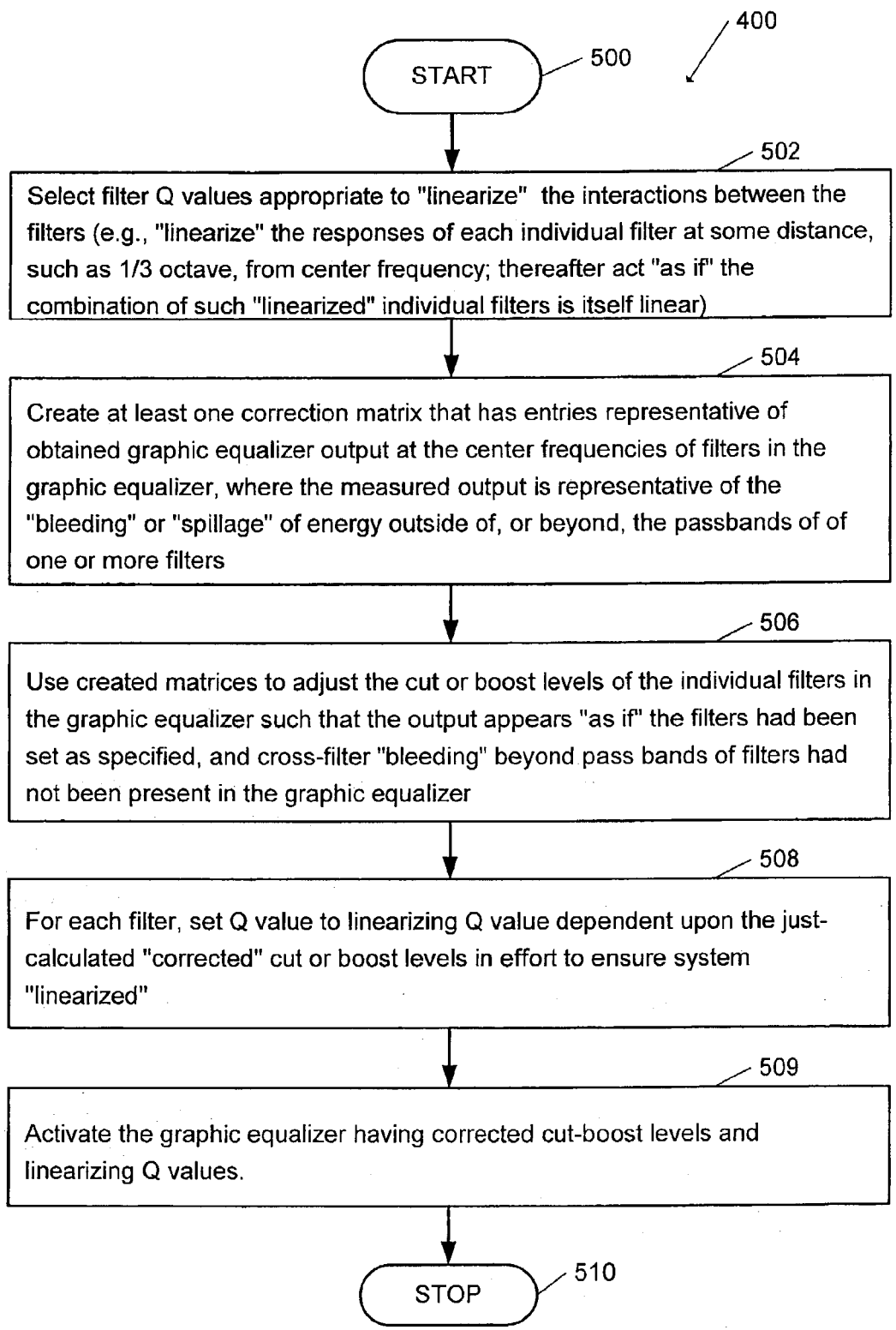
FIG. 4A is a high level logic flowchart of a process of the present invention.

With reference now to FIG. 4A, a preferred method for idealizing signal passband filters in accordance with the principles of the invention is generally indicated at reference numeral 400. FIG. 4A shows a high level logic flowchart of that process. Method step 500 depicts the start of the process. Method step 502 illustrates selecting filter Q values sufficient to approximately "linearize" the interactions between at least two bandpass filters (e.g., the three filters A, B and C shown and described in relation to graphic equalizer 100). Selecting Q values sufficient to approximately "linearize" interactions between filters consists of choosing, for each individual filter considered in isolation, a series of Q values dependent upon preselected cut or boost levels (e.g., 2, 4, or 6 dB, etc.). The Q values are chosen such that, when each individual filter is excited by a signal, and the cut or boost level of each individual filter is then increased or decreased in a linear fashion, the magnitude response of each individual filter, when measured at some predefined point-of-linearity reference frequency, will increase or decrease in a linear fashion (e.g., as shown and described in relation to FIG. 4C). In one embodiment, the point-of-linearity reference frequency is defined to be some distance (e.g., ⅓ of an octave) away from the center frequency of each individual filter (e.g., as shown and described in relation to FIG. 4C). Thereafter, the interactions between filters with Q values so chosen is treated "as if" the interactions between the filters were in fact linear.

Method step 504 shows the operation of the creation of at least one correction matrix which has entries representative of obtained graphic equalizer outputs at the center frequencies of filters in the graphic equalizer (e.g., the three filters A, B, and C shown and described in relation to graphic equalizer 100), where the measured output is due to energy from one or more filters spilling beyond their passbands. In other words, the correction matrix has entries representative of the "bleeding" of energy of one or more filters outside of their prescribed filter bands. In one embodiment, the outputs are obtained by numerical calculation or simulation. In another embodiment, the outputs are obtained by actual physical measurements of signals.

Method step 506 depicts the operation of using the at least one correction matrix illustrated in method step 504 to adjust the specified cut-or boost levels of the individual filters such that, in the aggregate, the adjusted cut-boost levels give rise to a modification of the output of the graphic equalizer which approximates the output which would have been present if the cut boost levels had been set as specified and the cross-filter "bleeding" from the respective filters had not been present in the filter system.

Method step 508 illustrates setting the Q value of each filter in the graphic equalizer to an appropriate "linearized" Q value. In one embodiment this is achieved by setting the Q value for each value dependent upon the just calculated "corrected" cut-boost value of each filter (e.g., that described in method step 506), which in one embodiment is achieved by a process substantially analogous to that described in relation to method step 502 (e.g., Qs are chosen for each filter based upon the corrected cut-boost value of each individual filter such that the response at the point of linearity varies linearly with the change from the specified cut boost level to the corrected cut boost level). In another embodiment, the Q of each filter is chosen to be that associated with the user specified Q of each filter.

Method step 509 illustrates the activation of the graphic equalizer, where the cut boost levels of the filters (e.g., the three filters A, B, and C shown and described in relation to graphic equalizer 100) have been set to the corrected cut boost levels described in relation to method step 508, and where the Q values of the filters have been set such that the individual responses of the filters in the graphic equalizer are linear at the defined point-of-linearity frequency.

Method step 510 shows the end of the process.

Figure 4B:
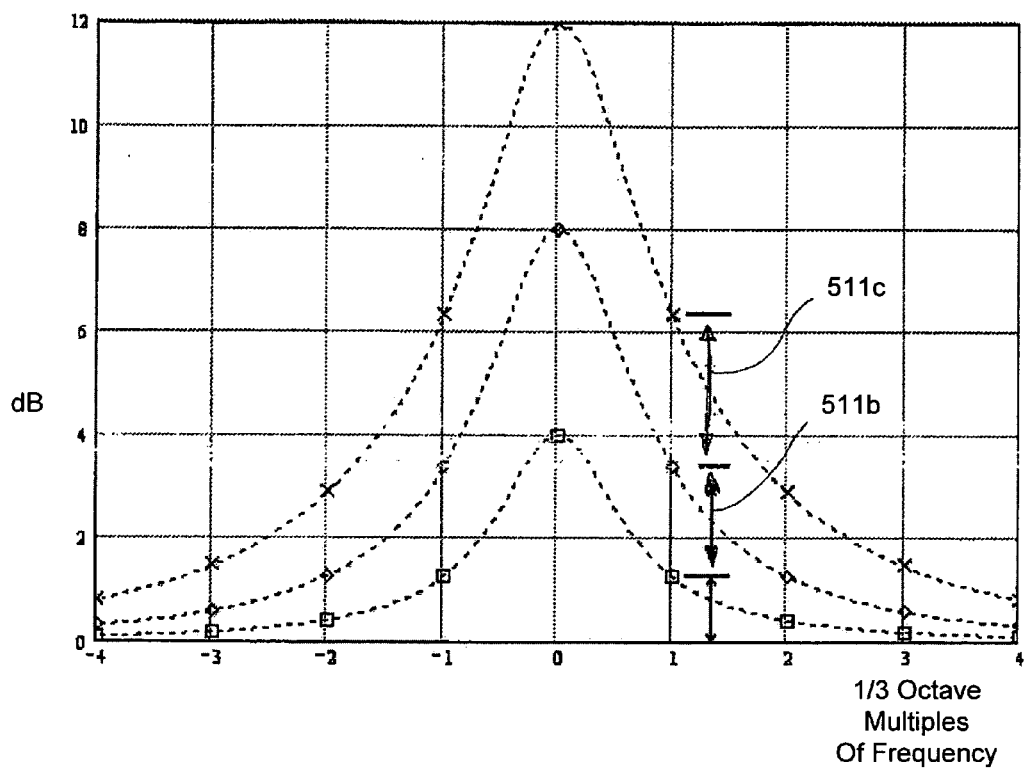
FIG. 4B is a graph depicting the response curves of a filter of the present invention when the cut-boost setting is adjusted in respective linear steps to 4, 8, and 12 dB of boost.

FIG. 4B shows a graph depicting the response curves of a filter when the cut-boost setting is adjusted in respective linear steps to 4, 8, and 12 dB of boost. Depicted is that for a filter with a constant Q value, the magnitude response levels at a distance of one-third an octave away from the center frequency of the filter do not change as a linear function of the setting. This can be seen in the graph from the fact that the cut-boost settings are changed in equal increments, but the responses at the one-third octave position differ 511$b$ and 511$c$ by unequal amounts.

Figure 4C:
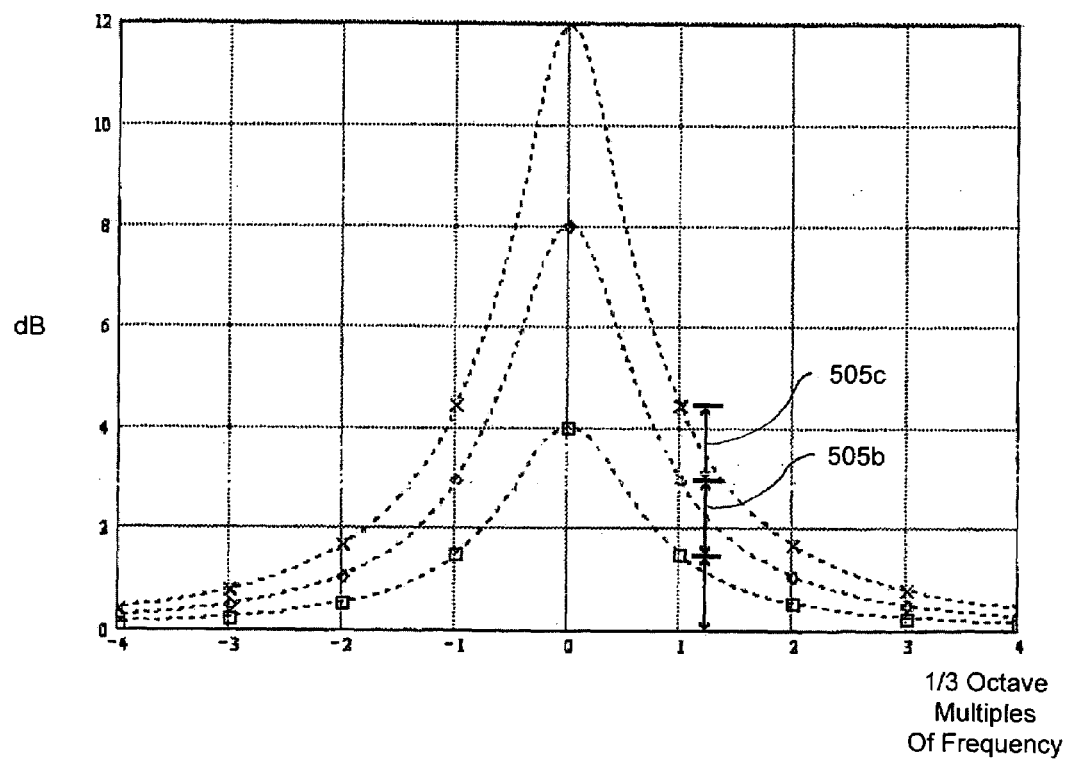
FIG. 4C is a graph illustrating response curves of an inventive filter wherein the Q values of a filter have been chosen dependent upon the specified cut-boost settings such that the magnitude response levels at one-third octave away from the center frequency of the filter have been "linearized."

FIG. 4C depicts a graph illustrating the response curves of a filter wherein the Q values of a filter have been chosen dependent upon the specified cut-boost settings such that the magnitude response levels at one-third octave away from the center frequency of the filter have been mathematically "linearized." The graph in FIG. 4C constitutes one specific example of an implementation of the operations shown and described in relation to method step 502. Specifically, the Q values have been chosen such that when the cut-boost settings are adjusted in respective linear steps to 4, 8, and 12 dB of boost with respect to center frequency $f_o$, the magnitude response levels at one-third octave away from the center frequency of the filter do change as a linear function of the setting, which as can be seen in the graph from the fact that when the cut boost settings are changed in equal increments, the responses at the one-third octave position differ 505$b$ and 505$c$ by equal amounts.

FIG. 4D illustrates three tables which show that for each filter in the graphic equalizer (e.g., filters A, B and C of graphic equalizer 100), Q values are determined such that when the cut-boost levels of the filters are varied in a linear fashion the magnitude responses at some defined distance away from the center frequency (e.g., ⅓ octave from the center frequency) vary in a linear fashion. The tables in FIG. 4D constitute one specific example of an implementation of the operations shown and described in relation to method step 502. Specifically, shown are that for filters having center frequencies A, B, and C, Q values $Q_A(dB)$, $Q_B(dB)$, and $Q_C(dB)$ are respectively chosen, as a function of the cut-boost decibel settings, such that the responses of the individual filters at some predefined distance from the center frequencies vary linearly when the cut-boost settings are varied linearly.

With reference now to FIGS. 5A1-3 and 5B, shown is a specific example of the generation of a correction matrix such as was shown and described in relation to method step 504. In one embodiment, there are two main steps in the creation of a correction matrix: (1) creation of a "spillage" matrix representing the "spillage," or "bleeding," of energy beyond the passband of one filter into the passband of one or more other filters, and (2) inversion of the spillage matrix.

Referring now to FIG. 5A1-3 depicted is a high-level logic flowchart showing a specific example of the creation of a spillage matrix based on a 6 dB setting of cut-boost controls of a graphic equalizer (e.g., graphic equalizer 100). Method step 630 shows the start of the process. Method step 632 illustrates that creation of the matrix column for Filter$_A$ involves first setting all of the cut-boost settings such that the output of the graphic equalizer at the center frequencies of the filters would be expected to be zero. As described herein, in one embodiment such settings are to 0 dB, rather than to maximum attenuation, because in one implementation the filters in graphic equalizer 100 are cascaded, and thus their transfer functions multiply. In another embodiment, where the filters of the graphic equalizer are in parallel rather than cascaded, those skilled in the art will appreciate that to achieve the same effect of zero output would be achieved by setting the parallel filters cut-boost settings to maximum attenuation, rather than zero dB.

Method step 634 shows that, subsequent to setting the gain of the filters such that the output of the graphic equalizer at the center frequency of the filters would be expected to be zero, the fact that the spillage matrix is to be created based on a 6 dB level is noted. Method step 636 depicts that, thereafter, the cut-boost level of the filter having center frequency A is set to 6 dB. Method step 638 illustrates that, thereafter, the $Q_A(6 \text{ dB})$, or the linearizing Q value of filter A, which is associated with a 6 dB setting of Filter$_A$ (e.g., such as shown and described in relation to FIG. 5D), is retrieved. Method step 640 shows that a filter having such $Q_A(6 \text{ dB})$ is subsequently constructed (e.g., computationally). Method step 642 illustrates that the graphic equalizer is excited with a signal (e.g., a "white noise" signal). Thereafter, method step 644 shows that the output magnitude of the graphic equalizer at the filter center frequencies are obtained (e.g., in one embodiment, via numerical simulation, and in another embodiment via actual physical measurement).

Figure 1:
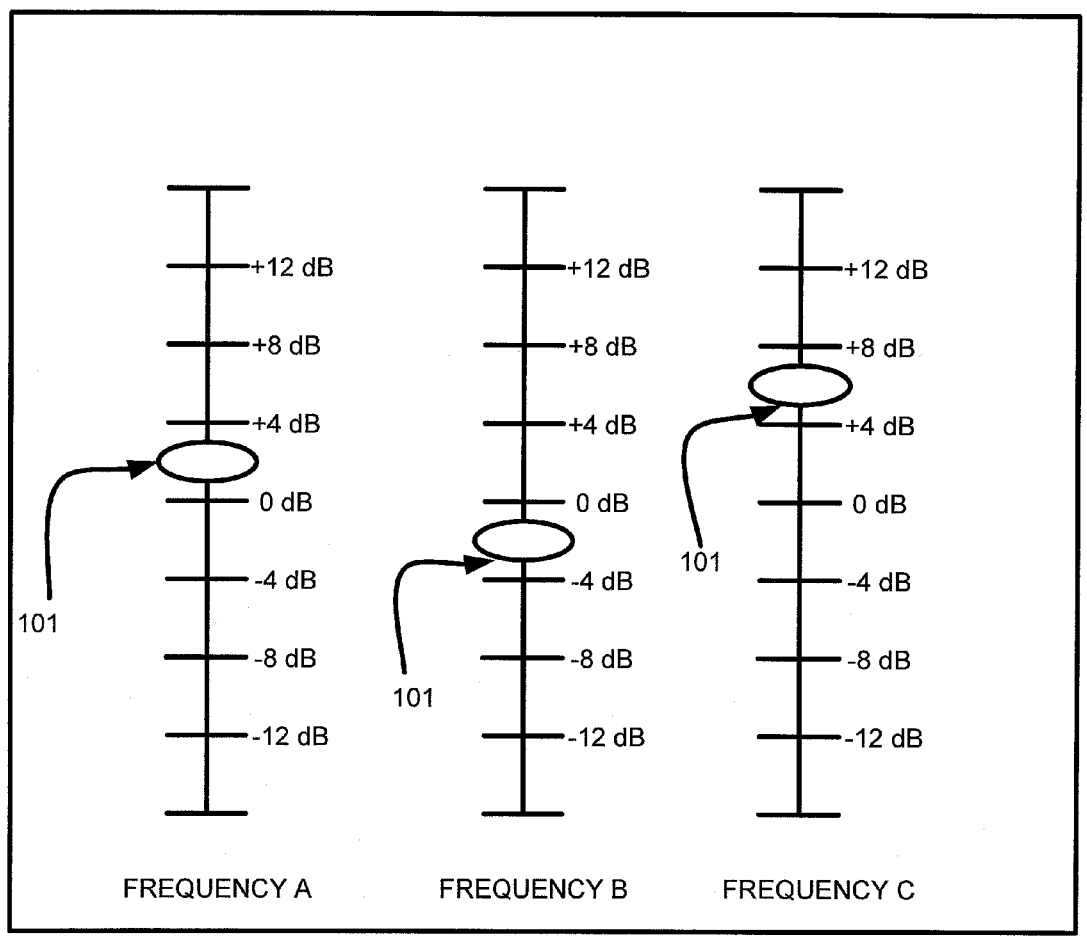
FIG. 1 is a front elevational view of a control panel of graphic equalizer 100.
Figure 2:
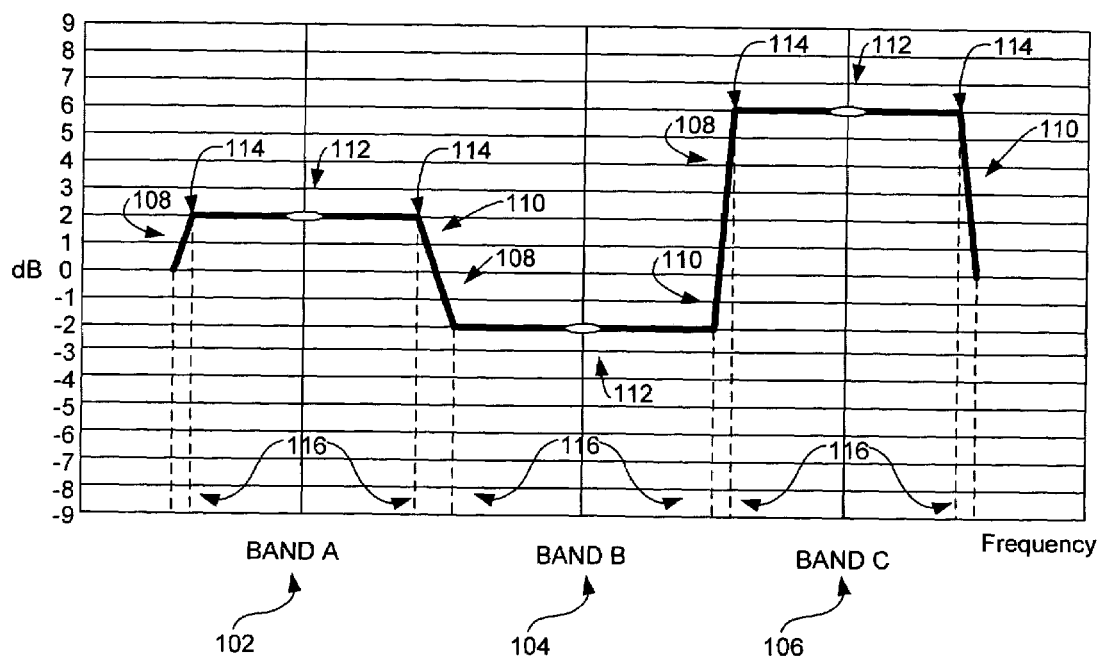
FIG. 2 is a graphic representation of magnitude responses of theoretical ideal filters which would preferably be used in conjunction with a graphic equalizer 100.
Figure 3:
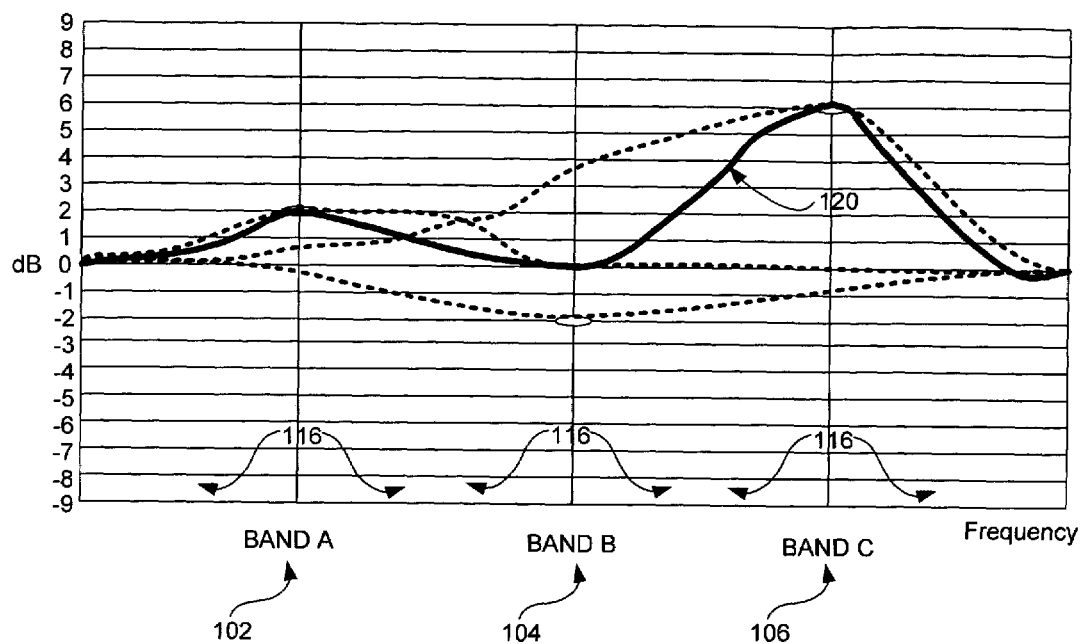
FIG. 3 is a graphic representation which depicts magnitude responses which are more representative of physically realizable, as opposed to ideal, filters.

Those skilled in the art will appreciate that since the filters have been adjusted as described, any output obtained at center frequencies other than center frequency A (e.g., obtained at center frequencies B and C) will be due to the "bleeding," or "spillage," of energy of A beyond its passband (e.g., spillage as illustrated and described in relation to FIG. 3). Accordingly, shown in method step 644 is that the column entries associated with center frequency A call out that the response at center frequency A is 6 dB, the response at center frequency B is due to the spillage of energy outside of A's passband, and the response at center frequency C is due to the spillage of energy outside of A's passband.

Continuing to refer to FIG. 5A1-3, shown are processes used to construct the matrix columns associated with Filter$_B$ (e.g., method steps 646-660) and Filter$_C$ (e.g, method steps 662-674). Specifically, shown is that, with respect to the columns in the spillage matrix associated with filters having center frequencies B and C, processes substantially analogous to the processes used to construct the column for FilterA are used.

With reference now to FIG. 5B, depicted is a spillage matrix 620 constructed as shown and described in FIG. 5A1-3. In one embodiment, a correction matrix is created from the spillage matrix shown by a two step process. First, the spillage matrix is normalized to generate a normalized matrix 621 by dividing the entries of the spillage matrix by the non-zero cut-boost settings utilized to generate the spillage matrix. Thereafter, the correction matrix 622 is obtained by inverting the normalized matrix 621. This correction matrix 622 may now be used as shown and described herein.

In one embodiment, as shown in the preceding example of FIGS. 5A1–3 and 5B, there is one correction matrix created on the basis of the non-zero cut-boost setting used to create the spillage matrix (e.g., the 6 dB level discussed in the example of FIGS. 5A1–3 and 5B). In other embodiments, there are actually multiple correction matrices created, where each correction matrix is unique to the non-zero cut-boost setting used to create the spillage matrix (e.g., a correction matrix based on 4 dB, a correction matrix based on 6 dB level, a correction matrix based on 8 dB, etc.). However, it has been found empirically that, due to the normalization of the spillage matrix as described above, in one embodiment the single described correction matrix works substantially as well as having correction matrices specific to the various cut boost levels.

FIGS. 6A and 6B show a specific example of how one embodiment uses the correction matrix to adjust the cut-boost settings of the individual filters to provide compensation such that the output of the graphic equalizer is "as if" no cross filter interference were present. For sake of illustration, it is assumed that a user (e.g., a human user) has set the cut boost level of $Filter_A$ to 2 dB, the cut boost level of $Filter_B$ to −2 dB, and the cut boost level of $Filter_C$ to 6 dB. Illustrated is that, in one embodiment, a column matrix 624 is created from the specified settings. Thereafter, the column matrix 624 is multiplied by the correction matrix 622, and that the resultant settings matrix 626 will be the original user specified settings plus or minus the aggregate adjustment necessary to make the output of the graphic equalizer function "as if" there were no cross filter interference present. The resultant matrix contains what are referred to herein as the corrected cut-boost settings 628 for $Filter_A$, $Filter_B$, and $Filter_C$.

With reference now to FIG. 6B, depicted is a high-level logic flowchart showing a specific example of how one embodiment uses the corrected cut-boost settings to ensure that the output of the graphic equalizer appears "as if" there were no cross filter interference. Method step 720 shows the start of the process. Method step 722 depicts that the cut-boost settings of $Filter_A$, $Filter_B$, and $Filter_C$ are set to their respective corrected levels. Thereafter, method step 724 shows that the linearized Q values appropriate to the settings of $Filter_A$, $Filter_B$, and $Filter_C$ are obtained, and filters having such Q values are constructed. In one embodiment this is achieved by setting digital filter coefficients in the cascaded filters forming graphic equalizer 100 (see FIG. 8), while in another embodiment discrete components of analog filters are adjusted to achieve the desired Q values. Subsequently, method step 726 illustrates that graphic equalizer 100 is activated. Method step 728 shows the end of the process.

FIG. 7, illustrates graphic equalizer 100 composed of cascaded digital filters which operate on frequency bands indexed from 0 to N−1. As noted above in relation to FIG. 6B, in one embodiment the digital filter coefficients of the filters making up graphic equalizer 100 are adjusted as appropriate such that each filter present has the Q value which will linearize the responses of the filters at some defined distance (e.g., ⅓ octave) from that filter's center frequency.

FIG. 8 shows an alternate view of the first cascaded filter depicted in FIG. 7.

The foregoing described figures and examples have illustrated the subject matter of the present application. However, in one particular application, the inventor has found it advantageous to implement a portion of the previously described processes and devices in real time, where the real time portion utilizes another portion of the previously described processes and devices which were pre-processed for use by the real time portion.

FIG. 9 shows a high-level logic flowchart depicting a real-time portion of one implementation of the herein described invention. Method step 700 illustrates the start of the process. Method step 702 shows reading from memory (e.g., random access memory in a conventional microprocessor—not shown) user specified settings of a graphic equalizer (e.g., such as were shown and described in relation to 6A, above). Those having ordinary skill in the art will recognize that these are ordinarily set by the equipment user.

Method step 704 depicts that in one implementation, the settings of the respective graphic equalizers are optionally convolved with a conventional smoothing filter. In one implementation, the foregoing is achieved by use of a simple moving average filter, while in other implementations, the foregoing is achieved by use of more sophisticated techniques (e.g., such as described in Addendum A) known to those of ordinary skill in the art. Specific implementation aspects of equations used in implementations of method step 704 are set forth under the "smoothing by moving average" section of Addendum A.

Method step 706 illustrates multiplying the settings S, described in relation to method step 702, by a recalled correction matrix M to get a matrix of corrected settings U, and thereafter set the cut-boost levels of the individual filters to the corrected values contained in matrix U (e.g., as was shown and described above in relation to FIG. 6A). In one embodiment, the recalled correction matrix was previously created and stored by the offline portion of the process depicted and described in relation to FIG. 10 below.

Method step 708 shows that the adjusted cut-boost settings of the filter are then used to specify and recall the closest linearizing Q values of each individual filter which match that of the corrected settings (e.g., as was shown and described in relation to FIG. 6B, above), and thereafter set the Q values of each filter to those closest linearizing Q values. In one embodiment, the recalled linearizing Q values were previously created and stored by the offline portion of the process depicted and described in relation to FIG. 10 below. It may seem more logical that Q values appropriate to the original user specified, as opposed to the corrected, cut-boost settings, be recalled and used. However, it has been unexpectedly found that the system actually provides advantages if the Q value appropriate to the corrected cut-boost settings is recalled and used. It is believed that this proves advantageous due to the filter interactions, but such understanding is not necessary to make and use the subject matter shown and described herein.

Method step 710 depicts, that with the linearizing Q values and the corrected cut-boost settings so defined, in one implementation digital filter coefficients are calculated for the filters of the graphic equalizer such that the filters will have the desired Q values at the corrected cut-boost levels. Calculating such digital filter coefficients is well within the capabilities of one having ordinary skill in the art without undue experimentation. However, one specific example implementation which provides such digital filter coefficients is set forth in Addendum A under the "Filter Design Formulas" heading.

Method step 712 illustrates the end of the real time portion.

With respect to the real-time implementation shown and described in relation to FIG. 9, aspects were described as being pre-processed in an offline portion, one example of which is set forth in FIG. 10.

With reference now to FIG. 10, shown is a high level logic flowchart illustrating a pre-processing, offline, portion of an implementation of the subject matter of the present application. Method step 600 depicts the start of the process. Method step 602 illustrates the operation of determining the number, N, of equalizer bands of a graphic equalizer. For example, N would be 3 bands for graphic equalizer 100, but those skilled in the art will recognize that more typical values for N would be 7, 15, 30, or 60.

Method step 604 shows that for each individual filter in the graphic equalizer, a set of linearizing Q values are calculated and stored such that the responses of each individual filter, at some distance (e.g., ⅓ octave) from the center frequency of the filter, vary linearly when the cut-boost settings of the individual filters are varied linearly. Thereafter, such linearizing Q values are available for use by the real-time portion, such as was shown and described in relation to FIG. 9.

Method step 606, which is optional and is not centrally related to the process illustrated in FIG. 10, takes into account that magnitude responses of digital filters are often warped at high frequencies. Optional method step 606 may be used to partially compensate for this warping by the somewhat reducing the chosen Q values if the filter under consideration is one that deals with either substantially the lowest or substantially the highest frequencies processed by the graphic equalizer.

Returning now to the main logic of the process illustrated by FIG. 10, method step 608 depicts the creation of a spillage matrix having the presence filter magnitude response on all center frequencies for each filter. Restated, the matrix will have entries which represent the measured magnitude response at the output of a graphic equalizer which is due to the presence of energy which has "bled" beyond the defined passbands of individual filters in the graphic equalizer. As shown and described in relation to FIGS. 5A1–3 and 5B above, in one embodiment, the spillage matrix is created by (1) setting the cut-boost values of all filters in a graphic equalizer such that the outputs associated with such filters should be zero, (2) setting the cut-boost level of one of the filters such that an output associated with the filter (e.g., the output at the filter's center frequency) should be a nonzero value, (3) exciting the graphic equalizer with a white noise signal, and (4) obtaining the magnitude response output of the graphic equalizer at each center frequency of each filter in the graphic equalizer.

With respect to setting the cut-boost values of all filters in a graphic equalizer such that the outputs associated with such filters should be zero, if the graphic equalizer is composed of cascaded filters, those skilled in the art will appreciate that the transfer functions of such cascaded filters multiply. Accordingly, the cut-boost level of the cascaded filters within the graphic equalizers would tend to be set to zero dB. Alternatively, if the graphic equalizer is composed of parallel filters, the same objective could be achieved by setting the gains of such parallel filters to maximum attenuation.

Method step 610 illustrates the operation of normalizing the correction matrix of method step 608 (e.g., such as shown and described in relation to FIG. 5B, above).

Method step 612 shows the operation of creating a correction matrix by inverting the normalized spillage matrix of method step 610 (e.g., such as was shown and described in relation to FIG. 5B, above). Shown is that, in one optional implementation, off-diagonal entries which are sufficiently small are truncated. What constitutes sufficiently small in any particular application is a design choice within the purview of the system designer dependent upon the tradeoff of accuracy versus speed of computation.

Method step 614 shows calculating the Q values of the filters dependent upon the filter settings (e.g., such as shown and described in relation to FIG. 5A1–3, above). Calculating such Q values, in light of the disclosure herein, is well within the capabilities of one having ordinary skill in the art and may be done without undue experimentation. However, one specific example implementation which provides such Q values is set forth in Addendum A under the "Determine a Q Function of Setting" heading.

Method step 616 shows choosing a smoothing filter value associated with each of the recalled Q values of method step 614, and storing such smoothing filters in association with such Q values so that such Q values are available for use by the real-time portion of the process as shown and described above in relation to FIG. 9.

Method step 618 shows the end of the off-line portion of the process.

Addendum A

Following are several formulas used in one implementation of various aspects of the subject matter disclosed herein. Those having ordinary skill in the art will understand that such formulas are merely examples, and that other formulas can be substituted with reasonable experimentation.

Examples of Formulas Used with Real-Time Portion of FIG. 9

Smoothing by Moving Average $$y_0 := 0.94 \cdot x_0 + 0.03 \cdot x_1$$

$$y_n := 0.03 \cdot x_{n-1} + 0.94 \cdot x_n + 0.03 \cdot x_{n+1} \text{ for } n \text{ in } [1, N-2]$$

$$y_{N-1} := 0.03 \cdot x_{N-2} + 0.94 \cdot x_{N-1}$$

Improved Smoothing

There is an initial step in the real-time portion of that has been termed smoothing, and it allows the method to perform better in two ways. Without smoothing, the method chooses actual settings that result in a response that closely matches the original settings at those points. This normally works very well, but two undesirable effects are observed.

One of these occurs when the requested settings result in actual settings that become extreme in an attempt to satisfy the request. The worst case of this is when alternate bands are set at their opposite extremes, such as +/−12 dB. The actual settings can be more than twice this, or +/−24 dB, and this is undesirable, since it adversely affects digital filter design and increases noise. Constraining the settings after the fact results in a distorted frequency response because adjacent bands are set so as to compensate for the extreme setting.

This is better dealt with by modifying the requested settings, and one way to do this is with a simple moving average. Unfortunately, this has undesirable effects. When a single filter is boosted or cut, the result doesn't quite reach the setting. And in general, the response is always affected, whether or not it needs to be. A more effective method starts by estimating the curvature or second derivative using $x(k-1) - 2x(k) + x(k+1) = C$, where $x(k)$ is a given filter setting, $x(k-1)$ is to the left, and $x(k+1)$ to the right. If C is greater than a preset value (say 24), the setting is altered by something like $0.125*(C-24)$. Or if C is less than −24, then we can use 0.125*(C+24). This constrains requested settings with extreme variations just enough to keep the actual settings within +/−24 dB.

The other undesirable effect is overshoot in the frequency response when there is a large step followed by a relatively flat area. The method will match the request, but is unable to control the response between filters, and the characteristics of the filters prevent a rectangular response step.

Overshoot is reduced or eliminated by making the transition slightly less abrupt. A subtle modification is all that is needed. The difference between a given setting and its neighbors is calculated, which is a simple estimate of slope. If the minimum of the magnitude of the two slopes is below a preset value (say 3 dB), a linear function is applied to that slope to progressively increase the correction for smaller slopes. This is then multiplied by the curvature C, and the result is subtracted from the current band setting. If the minimum slope is M, then we can alter the setting by (0.6−0.2*M)*C/12. The curvature is used instead of the maximum slope, since it is already calculated and works well.

Perfect-Q Correction $$U_{band} := \sum_{k=0}^{N-1} M_{band,k} \cdot S_k$$

Determine Level for Each Band by Matrix Multiplication $$Q_{band} := Qa(U_{band}) \cdot B_{band}$$

Determine Q for Each Band

Filter Design Formulas (Others are Possible)

$$a_1(\omega_o, Fs, dB, Q) := -b_1(\omega_o, Fs, dB, Q)$$

$$a_2(\omega_o, Fs, dB, Q) := 1 - a_o(\omega_o, Fs, dB, Q) - b_2(\omega_o, Fs, dB, Q)$$

This is the filter magnitude response as a function of the filter coefficients and the frequency of interest and sample rate Fs. It corresponds to the analog filter Mag( ) function given earlier. In one implementation, in order to reduce frequency response artifacts due to coefficient quantization, the a1 and a2 formulas should be applied after scaling and rounding the other coefficients.

$$Mag(a0, a1, a2, b1, b2, Fs, \omega) := 20 \cdot \log \left\| \frac{a0 + a1 \cdot e^{-i\frac{\omega}{Fs}} + a2 \cdot e^{-2i\frac{\omega}{Fs}}}{1 - b1 \cdot e^{-i\frac{\omega}{Fs}} - b2 \cdot e^{-2i\frac{\omega}{Fs}}} \right\|$$

Examples of Formulas Used with Offline Portion of FIG. 10

Presence Filter Magnitude Response $$Mag(Q, \omega_0, \omega, dB) :=$$

$$20 \cdot \log \left\| 1 + \left(10^{\frac{dB}{20}} - 1\right) \cdot \frac{\frac{j \cdot \omega}{\omega_o Q}}{\frac{-\omega^2}{\omega_o^2} + \frac{j \cdot \omega}{\omega_o \cdot Q} + 1} \right\|$$

angular frequency:
$\omega := 2 \cdot \pi \cdot f$

This gives dB magnitude response for an analog filter, given filter Q, design angular frequency, response angular $$d(\omega_o, Fs, dB, Q) := \left| \begin{array}{l} 1 + \frac{\sin\left(\frac{\omega_o}{Fs}\right)}{2 \cdot Q} \text{ if } dB \geq 0 \\ 1 + \frac{10^{-0.05 \cdot dB} \cdot \sin\left(\frac{\omega_o}{Fs}\right)}{2 \cdot Q} \text{ otherwise} \end{array} \right.$$

This filter is the simplest digital equivalent of the analog filter. These formulas determine the filter coefficients a0, a1, a2, b1, b2, which are then used in the Mag( ) function. The d( ) function is used by the others.

$$a_0(\omega_o, Fs, dB, Q) := \left| \begin{array}{l} \frac{1 + \frac{10^{0.05 \cdot dB} \cdot \sin\left(\frac{\omega_o}{Fs}\right)}{2 \cdot Q}}{d(\omega_o, Fs, dB, Q)} \text{ if } dB \geq 0 \\ \frac{1 + \frac{\sin\left(\frac{\omega_o}{Fs}\right)}{2 \cdot Q}}{d(\omega_o, Fs, dB, Q)} \text{ otherwise} \end{array} \right.$$

$$b_1(\omega_o, Fs, dB, Q) := \frac{2 \cdot \cos\left(\frac{\omega_o}{Fs}\right)}{d(\omega_o, Fs, dB, Q)}$$

$$b_2(\omega_o, Fs, dB, Q) := \left| \begin{array}{l} \frac{-\left[1 - \frac{\sin\left(\frac{\omega_o}{Fs}\right)}{2 \cdot Q}\right]}{d(\omega_o, Fs, dB, Q)} \text{ if } dB \geq 0 \\ -\left[\frac{1 - \frac{10^{-0.05 \cdot dB} \cdot \sin\left(\frac{\omega_o}{Fs}\right)}{2 \cdot Q}}{d(\omega_o, Fs, dB, Q)}\right] \text{ otherwise} \end{array} \right.$$

frequency, and dB setting. The invention may use analog filters, or digital filters as long as they have a very similar response. For maximum accuracy, the corresponding formulas in the Filter Design Formulas section should be used for digital filters.

one third octave constant:
(typical frequency spacing factor of EQ bands)

$$w := 2^{\frac{1}{3}}$$

Here we construct the matrix of filter responses measured at one-third octave frequencies, then invert the matrix. Each column represents the response of one filter, and the rows are the responses of all filters at one filter's frequency. The response is normalized by dividing by the setting.

$$A_{row,col} := \frac{Mag(Q_o \cdot B_{col}, 1, w^{row-col}, dB_o)}{dB_o}$$

$$M := A^{-1}$$

Determine a Q Function of Setting

These are derived from the equation for the analog filter response.

$$C(w, Q_o, dB_o) := 0.5 \cdot \frac{\log\left[\frac{(1-w^2)^2 + 10^{\frac{dB_o}{10}} \cdot w^2 \cdot Q_o^{-2}}{(1-w^2)^2 + w^2 \cdot Q_o^{-2}}\right]}{\log(10^{\frac{dB_o}{20}})}$$

Find $C$ from given $Q$ and dB.
$w$ is $1/3$ octave, given above.

$$Q(dB) := \sqrt{\frac{(10^{\frac{dB}{10}}) - (10^{\frac{dB}{10}})^C}{(10^{\frac{dB}{10}})^C - 1} \cdot \frac{w}{(w^2-1)}}$$

We know $C$ (and $w$), so we have a $Q$ function of dB setting.

$$Qa(dB) := 3 + 0.07|dB| + 0.0014 \cdot dB^2$$

This is a second degree approximation of Q(dB) Qo=4, dBo=6

Filter Portion

The EQ is formed by cascading the filters for each band. At any given frequency, the resulting response is the sum of the individual responses in dB, because in the linear domain it is the product, and dB is a logarithmic scale.

$$TotalMag(\omega) := \sum_{band} Mag((band), \omega)$$

Each filter is a standard biquadratic section, with difference equation given by:

$$y_n := a0 \cdot x_n + a1 \cdot x_{n-1} + a2 \cdot x_{n-2} + b1 \cdot y_{n-1} + b2 \cdot y_{n-2}$$

Those having ordinary skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost versus efficiency tradeoffs. Those having ordinary skill in the art will appreciate that there are various vehicles by which aspects of processes and/or systems described herein can be effected (e.g., hardware, software, and/or firmware), and that the preferred vehicle will vary with the context in which the processes and/or systems are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which aspects of the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs). However, those skilled in the art will recognize that the embodiments disclosed herein, in whole or in part, can be equivalently implemented in standard Integrated Circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analogue communication links using TDM or IP based communication links (e.g., packet links).

In a general sense, those skilled in the art will recognize that the various embodiments described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into data processing systems. That is, the devices and/or processes described herein can be integrated into a various systems via a reasonable amount of experimentation.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for use with equipment having filters comprising:
  multiplying a matrix having a specified cut-boost setting of a filter of a graphic equalizer by a correction matrix to create a matrix having a corrected cut-boost setting of the filter of the graphic equalizer;
  adjusting an actual cut-boost setting of the filter of the graphic equalizer to be substantially equal to the corrected cut-boost setting of the filter of the graphic equalizer; and
  configuring the filter to have a Q value substantially equal to a linearizing Q value such that the linearizing Q-value corresponds to maintaining a cut-boost change for a center frequency of the filter that is linear with respect to a non-zero cut-boost change for at least one other frequency.

2. The method of claim 1, wherein said multiplying a matrix having a specified cut-boost setting of a filter of a graphic equalizer by a correction matrix to create a matrix having a corrected cut-boost setting of the filter of the graphic equalizer comprises:
  generating the correction matrix based on at least one Q value that approximately linearizes at least one interaction between at least two filters.

3. The method of claim 2, wherein said generating the correction matrix based on at least one Q value that approximately linearizes at least one interaction between at least two filters comprises:
  generating the at least one Q value that approximately linearizes at least one interaction between at least two filters.

4. The method of claim 3, wherein said generating the at least one Q value that approximately linearizes at least one interaction between at least two filters comprises:

selecting a center frequency of a bandpass filter;
selecting a first cut-boost setting and a first Q value for the bandpass filter;
selecting a second cut-boost setting for the bandpass filter;
selecting a point-of-linearity reference frequency;
calculating a second Q value for the bandpass filter such that, at the point-of-linearity reference frequency, a difference between a magnitude response of the bandpass filter at the first cut-boost setting and the magnitude response of the band pass filter at the second cut-boost setting is within a defined tolerance; and
storing, for the bandpass filter, the first and the second Q values respectively paired with the first and the second cut-boost settings.

5. The method of claim 4, wherein the point-of-linearity reference frequency comprises a frequency one-third of an octave away from the center frequency of the bandpass filter.

6. The method of claim 4, wherein the defined tolerance comprises the difference between the magnitude response of the bandpass filter at the first cut-boost setting and the magnitude response of the bandpass filter at the second cut-boost setting at the point-of-linearity reference frequency which is linearly proportional to a difference between the first cut-boost setting and the second cut-boost setting.

7. The method of claim 6, wherein the difference between the magnitude response of the bandpass filter at the first cut-boost setting and the magnitude response of the bandpass filter at the second cut-boost setting at the point-of-linearity reference frequency which is linearly proportional to a difference between the first cut-boost setting and the second cut-boost setting comprises:
a difference between the magnitude response of the bandpass filter at the first cut-boost setting and the magnitude response of the bandpass filter at the second cut-boost setting at the point-of-linearity reference frequency which is substantially the same as a difference between the magnitude response of the bandpass filter at the first cut-boost setting and a magnitude response of the bandpass filter at a specified baseline cut-boost setting.

8. The method of claim 2, wherein said generating the correction matrix based on at least one Q value that approximately linearizes at least one interaction between at least two filters comprises:
building a matrix having at least one filter magnitude response, where at least one column entry of the matrix represents a magnitude response produced at a center frequency of a first filter due to an operation of a second filter having a second center frequency different than the center frequency of the first filter.

9. The method of claim 8, wherein said building a matrix having at least one filter magnitude response, where at least one column entry of the matrix represents a magnitude response produced at a center frequency of a first filter due to an operation of a second filter having a second center frequency different than the center frequency of the first filter comprises:
specifying a cut-boost level different from a cut-boost level associated with a substantially zero output provided by the graphic equalizer;
adjusting a cut-boost setting of the first filter to the cut-boost level different from the cut-boost level associated with the substantially zero output;
adjusting a cut-boost setting of the second filter to the cut-boost level associated with the substantially zero output;

stimulating the graphic equalizer with a signal;
obtaining a magnitude response at a center frequency of the second filter;
saving the magnitude response at the center frequency of the second filter in association with the second filter;
adjusting the cut-boost setting of the first filter to the cut-boost level associated with the substantially zero output;
adjusting the cut-boost setting of the second filter to the cut-boost level different from the cut-boost level associated with the substantially zero output,
obtaining a magnitude response at the center frequency of the first filter;
saving the magnitude response at the center frequency of the first filter in association with the first filter; and
saving the magnitude responses in a matrix having association with the cut-boost level different from the cut-boost level associated with the substantially zero output.

10. The method of claim 2, wherein said generating the correction matrix based on at least one Q value that approximately linearizes at least one interaction between at least two filters comprises:
inverting a matrix having at least one filter magnitude response, where at least one column entry of the matrix represents a magnitude response produced at a center frequency of a first filter due to an operation of a second filter having a second center frequency different than the center frequency of the first filter.

11. The method of claim 10, wherein said inverting a matrix having at least one filter magnitude response, where at least one column entry of the matrix represents a magnitude response produced at a center frequency of a first filter due to an operation of a second filter having a second center frequency different than the center frequency of the first filter comprises:
normalizing the matrix prior to said inverting.

12. The method of claim 1, wherein said configuring the filter to have a Q value substantially equal to a linearizing Q value comprises:
determining a corrected cut-boost setting of the filter;
obtaining the linearizing Q value in response to the corrected cut-boost setting; and
calculating at least one digital filter coefficient for the filter such that the filter has substantially the recalled linearizing Q value.

13. The method of claim 1, wherein said configuring the filter to have a O value substantially equal to a linearizing Q value comprises:
determining a corrected cut-boost setting of the filter;
obtaining the linearizing Q value in response to the corrected cut-boost setting; and
adjusting at least one analog filter component for the filter such that the filter has substantially the linearizing Q value.

14. The method of claim 1, wherein said multiplying a matrix having a specified cut-boost setting of a filter of a graphic equalizer by a correction matrix to create a matrix having a corrected cut-boost setting of the filter of the graphic equalizer comprises:
applying a smoothing function to the specified cut-boost setting of the filter prior to said multiplying, whereby compensation occurs for system disturbances resulting from at least one of extreme cut-boost corrected settings and frequency response overshoot.

15. A system operably coupled with equipment having filters comprising:
- means for multiplying a matrix having a specified cut-boost setting of a filter of a graphic equalizer by a correction matrix to create a matrix having a corrected cut-boost setting of the filter of the graphic equalizer;
- means for adjusting an actual cut-boost setting of the filter of the graphic equalizer to be substantially equal to the corrected cut-boost setting of the filter of the graphic equalizer; and
- means for configuring the filter to have a Q value substantially equal to a linearizing Q value such that the linearizing Q-value corresponds to maintaining a cut-boost change for a center frequency of the filter that is linear with respect to a non-zero cut-boost change for at least one other frequency.

16. The system of claim 15, wherein said means for multiplying a matrix having a specified cut-boost setting of a filter of a graphic equalizer by a correction matrix to create a matrix having a corrected cut-boost setting of the filter of the graphic equalizer comprises:
- means for generating the correction matrix based on at least one Q value that approximately linearizes at least one interaction between at least two filters.

17. The system of claim 16, wherein said means for generating the correction matrix based on at least one Q value that approximately linearizes at least one interaction between at least two filters comprises:
- means for generating the at least one Q value that approximately linearizes at least one interaction between at least two filters.

18. The system of claim 17, wherein said means for generating the at least one Q value that approximately linearizes at least one interaction between at least two filters comprises:
- means for selecting a center frequency of a bandpass filter;
- means for selecting a first cut-boost setting and a first Q value for the band pass filter;
- means for selecting a second cut-boost setting for the bandpass filter;
- means for selecting a point-of-linearity reference frequency;
- means for calculating a second Q value for the bandpass filter such that, at the point-of-linearity reference frequency, a difference between a magnitude response of the bandpass filter at the first cut-boost setting and the magnitude response of the bandpass filter at the second cut-boost setting is within a defined tolerance; and
- means for storing, for the band pass filter, the first and the second Q values respectively paired with the first and the second cut-boost settings.

19. The system of claim 18, wherein the point-of-linearity reference frequency comprises a frequency one-third of an octave away from the center frequency of the band pass filter.

20. The system of claim 18, wherein the defined tolerance comprises the difference between the magnitude response of the bandpass filter at the first cut-boost setting and the magnitude response of the band pass filter at the second cut-boost setting at the point-of-linearity reference frequency which is linearly proportional to a difference between the first cut-boost setting and the second cut-boost setting.

21. The system of claim 20, wherein the difference between the magnitude response of the bandpass filter at the first cut-boost setting and the magnitude response of the band pass filter at the second cut-boost setting at the point-of-linearity reference frequency which is linearly proportional to a difference between the first cut-boost setting and the second cut-boost setting comprises:
- a difference between the magnitude response of the bandpass filter at the first cut-boost setting and the magnitude response of the band pass filter at the second cut-boost setting at the point-of-linearity reference frequency which is substantially the same as a difference between the magnitude response of the band pass filter at the first cut-boost setting and a magnitude response of the bandpass filter at a specified baseline cut-boost setting.

22. The system of claim 16, wherein said means for generating the correction matrix based on at least one Q value that approximately linearizes at least one interaction between at least two filters comprises:
- means for building a matrix having at least one filter magnitude response, where at least one column entry of the matrix represents a magnitude response produced at a center frequency of a first filter due to an operation of a second filter having a second center frequency different than the center frequency of the first filter.

23. The system of claim 22, wherein said means for building a matrix of at least one filter magnitude response, where at least one column entry of the matrix represents a magnitude response produced at a center frequency of a first filter due to an operation of a second filter having a second center frequency different than the center frequency of the first filter comprises:
- means for specifying a cut-boost level different from a cut-boost level associated with a substantially zero output provided by the graphic equalizer;
- means for adjusting a cut-boost setting of the first filter to the cut-boost level different from the cut-boost level associated with the substantially zero output;
- means for adjusting a cut-boost setting of the second filter to the cut-boost level associated with the substantially zero output;
- means for stimulating the graphic equalizer with a signal;
- means for obtaining a magnitude response at a center frequency of the second filter;
- means for saving the magnitude response at the center frequency of the second filter in association with the second filter;
- means for adjusting the cut-boost setting of the first filter to the cut-boost level associated with the substantially zero output;
- means for adjusting the cut-boost setting of the second filter to the cut-boost level different from the cut-boost level associated with the substantially zero output;
- means for obtaining a magnitude response at the center frequency of the first filter
- means for saving the magnitude response at the center frequency of the first filter in association with the first filter; and
- means for saving the magnitude responses in a matrix having association with the cut-boost level different from the cut-boost level associated with the substantially zero output.

24. The system of claim 16, wherein said means for generating the correction matrix based on at least one Q value that approximately linearizes at least one interaction between at least two filters comprises:
- means for inverting a matrix having at least one filter magnitude response, where at least one column entry of the matrix represents a magnitude response produced at a center frequency of a first filter due to an operation of a second filter having a second center frequency different than the center frequency of the first filter.

25. The system of claim 24, wherein said means for inverting a matrix having at least one filter magnitude response, where at least one column entry of the matrix represents a magnitude response produced at a center frequency of a first filter due to an operation of a second filter having a second center frequency different than the center frequency of the first filter comprises:
   means for normalizing the matrix prior to said inverting.

26. The system of claim 15, wherein said means for configuring the filter to have a Q value substantially equal to a linearizing Q value comprises:
   means for determining a corrected cut-boost setting of the filter; means for obtaining the linearizing Q value in response to the corrected cut-boost setting; and
   means for calculating at least one digital filter coefficient for the filter such that the filter has substantially the linearizing Q value.

27. The system of claim 15, wherein said means for configuring the filter to have a Q value substantially equal to a linearizing Q value comprises:
   means for determining a corrected cut-boost setting of the filter; means for obtaining the linearizing Q value in response to the corrected cut-boost setting; and
   means for adjusting at least one analog filter component for the filter such that the filter has substantially the linearizing Q value.

28. The system of claim 15, wherein said means for multiplying a matrix having a specified cut-boost setting of a filter of a graphic equalizer by a correction matrix to create a matrix having a corrected cut-boost setting of the filter of the graphic equalizer comprises:
   means for applying a smoothing function to the specified cut-boost setting of the filter prior to said multiplying, whereby compensation occurs for system disturbances resulting from at least one of extreme cut-boost corrected settings and frequency response overshoot.

29. The system of claim 15, wherein the system operably coupled with equipment having filters comprises:
   at least one of a public address system, an entertainment system, a computer system, an automobile having an entertainment system, a watercraft having an entertainment system, and an aircraft having an entertainment system.

30. A system for use with equipment having filters comprising:
   multiplying circuitry for multiplying a matrix having a specified cut-boost setting of a filter of a graphic equalizer by a correction matrix to create a matrix having a corrected cut-boost setting of the filter of the graphic equalizer, said circuitry including at least one of electrical circuitry having at least one discrete electrical circuit, electrical circuitry having at least one integrated circuit, electrical circuitry having at least one application specific integrated circuit, electrical circuitry having a general purpose computing device configured by a computer program, electrical circuitry having a memory device, and electrical circuitry having a communications device;
   adjusting circuitry for adjusting an actual cut-boost setting of the filter of the graphic equalizer to be substantially equal to the corrected cut-boost setting of the filter of the graphic equalizer, said circuitry including at least one of electrical circuitry having at least one discrete electrical circuit, electrical circuitry having at least one integrated circuit, electrical circuitry having at least one application specific integrated circuit, electrical circuitry having a general purpose computing device configured by a computer program, electrical circuitry having a memory device, and electrical circuitry having a communications device; and
   configuring circuitry for configuring the filter to have a Q value substantially equal to a linearizing Q value such that the linearizing Q-value corresponds to maintaining a cut-boost change for a center frequency of the filter that is linear with respect to a non-zero cut-boost change for at least one other frequency, said circuitry including at least one of electrical circuitry having at least one discrete electrical circuit, electrical circuitry having at least one integrated circuit, electrical circuitry having at least one application specific integrated circuit, electrical circuitry having a general purpose computing device configured by a computer program, electrical circuitry having a memory device, and electrical circuitry having a communications device.

31. A method for use with equipment having filters comprising:
   generating a settings matrix indicative of boost/cut settings of at least two of the filters;
   generating a correction matrix;
   multiplying the settings matrix by the correction matrix to create a corrected matrix having a corrected cut-boost setting of the filter of the graphic equalizer;
   adjusting an actual cut-boost setting of the filter of the graphic equalizer to be substantially equal to the corrected cut-boost setting of the filter of the graphic equalizer; and
   configuring the filter to have a Q value substantially equal to a linearizing Q value such that the linearizing Q-value corresponds to maintaining a cut-boost change for a center frequency of the filter that is linear with respect to a non-zero cut-boost change for at least one other frequency, whereby cross-filter interference is reduced.

32. The method of claim 31, wherein said generating a correction matrix step comprises generating at least one Q value that approximately linearizes at least one interaction between at least two filters.

33. The method of claim 31, wherein said generating the correction matrix step comprises exciting the equipment having filters with a signal.

34. A system operably coupled with equipment having filters comprising:
   means for generating a settings matrix indicative of boost/cut settings of at least two of the filters;
   means for generating a correction matrix;
   means for multiplying the settings matrix by the correction matrix to create a corrected matrix having a corrected cut-boost setting of the filter of the graphic equalizer;
   means for adjusting an actual cut-boost setting of the filter of the graphic equalizer to be substantially equal to the corrected cut-boost setting of the filter of the graphic equalizer; and
   means for configuring the filter to have a Q value substantially equal to a linearizing Q value such that the linearizing Q-value corresponds to maintaining a cut-boost change for a center frequency of the filter that is linear with respect to a non-zero cut-boost change for at least one other frequency, whereby cross-filter interference is reduced.

* * * * *